(12) United States Patent
Dalmia et al.

(10) Patent No.: US 6,307,413 B1
(45) Date of Patent: Oct. 23, 2001

(54) REFERENCE-FREE CLOCK GENERATOR AND DATA RECOVERY PLL

(75) Inventors: Kamal Dalmia, Austin, TX (US); Anil Agarwal, Bangalore (IN)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/471,914

(22) Filed: Dec. 23, 1999

(51) Int. Cl.$^7$ ....................................................... H03K 5/01
(52) U.S. Cl. .......................... 327/166; 327/150; 327/159
(58) Field of Search ................................... 327/165, 146, 327/148, 150, 157, 159, 166, 47

(56) References Cited

U.S. PATENT DOCUMENTS

| | | | | |
|---|---|---|---|---|
| 4,940,952 | * | 7/1990 | Kegasa | 331/11 |
| 5,739,709 | * | 4/1998 | Banno | 327/156 |
| 5,950,115 | * | 9/1999 | Momtaz et al. | 455/73 |

OTHER PUBLICATIONS

A 1Gb/s CMOS Clock and Data Recovery Circuit, by Hui Wang and Richard Nottenburg, 1999 IEEE International Solid–State Circuits Conference, Feb. 17, 1999, pp. 354–355.

Kamal Dalmia, et al., Data Frequency Detector, Ser. No. 09/471,915, Filed Dec. 23, 1999.

Kamal Dalmia, Digital Phase/Frequency Detector, and Clock Generator and Data Recovery PLL Containing the Same, Ser. No. 09/470,665, Filed Dec. 23, 1999.

Kamal Dalmia, Reference–Free Clock Generator and Data Recovery PLL, Ser. No. 09/471,576, Filed Dec. 23, 1999.

\* cited by examiner

*Primary Examiner*—My-Trang Nu Ton
*Assistant Examiner*—Cassandra Cox
(74) *Attorney, Agent, or Firm*—Christopher P. Malorana, P.C.

(57) ABSTRACT

An apparatus comprising a first circuit, a second circuit and a logic circuit. The first circuit may be configured generate a first output signal having a first data rate and in response to (i) an input signal having a second data rate and (ii) a clock signal having the second data rate. The second circuit may be configured to generate a second output signal having a third data rate in response to (i) a divided version of the input signal and (ii) the clock signal. The logic circuit may be configured to generate the clock signal in response to (i) the first output signal and (ii) the second output signal.

19 Claims, 6 Drawing Sheets

REFERENCE-FREE CLOCK GENERATOR AND DATA RECOVERY PLL

CROSS REFERENCE TO RELATED APPLICATIONS

The present application may relate to application Ser. No. 09/471,915, Ser. No. 09/470,665 and Ser. No. 09/471,576, filed concurrently and each hereby incorporated by reference in their entirety.

FILED OF THE INVENTION

The present invention relates to clock and data recovery in a phase-lock loop (PLL) generally and, more particularly, to a method and/or architecture for a linear data clock and recovery of half-rate clock signals (e.g., 0 and 90 degree phases) from a serial input data stream.

BACKGROUND OF THE INVENTION

Referring to FIG. 1, a conventional circuit 10 for performing clock and data recovery in a serial data communication device is shown. The circuit 10 requires a reference clock and a clock difference detector. The circuit 10 comprises a half-rate VCO 12, a divider 14, a feedback (FB) divider 15, a frequency difference detector (FDD) 16, a half-rate phase detector (PD) 18, a phase-frequency detector (PFD) 20, a multiplexer 22 and a charge pump filter (CPF) 24. The VCO 12 presents signals from a number of outputs 26a–26n to a number of inputs 27a–27n of the divider 14.

The divider 14 divides the inputs by "M" and presents a clock signal CLOCK-00 and a clock signal CLOCK-90. The clock signal CLOCK-00 is presented to an input 30 of feedback divider 15. The clock signals CLOCK-00 and CLOCK-90 are presented to a number of inputs 32a–32n of the phase detector 18. The divider 15 divides the clock signal CLOCK-00 and presents a divided clock signal DIVIDED at an output 34. The clock signal DIVIDED is presented to an input 36 of the phase-frequency detector 20 and to an input 38 of the frequency difference detector 16.

A reference clock signal REFCLK_IN is presented to an input 40 of the phase-frequency detector 20 and an input 42 of the frequency difference detector 16. The phase-frequency detector 20 compares the signals REFCLK_IN and DIVIDED. A data signal DATA is presented to an input 44 of the phase detector 18. The phase detector 18 has an output 46 that is connected to the multiplexer 22. The phase-frequency detector 20 has an output 48 that is connected to the multiplexer 22. The outputs 46 and 48 present pump-up and pump-down signals.

The multiplexer 22 has an input 50 that receives a control signal LLC. The multiplexer 22 presents a multiplexed signal to an input 52 of the charge pump filter 24 in response to the signal LLC. The frequency difference detector 16 has an output 54 that presents the signal LLC. The frequency difference detector 16 compares the clock signal REFLCK_IN and the clock signal DIVIDED. If the two frequencies are within a certain range, the frequency difference detector 16 toggles the signal LLC. The signal LLC controls the "locking" of the PLL to the clock signal REFCLK_IN or the signal DATA. When the PLL is frequency locked to the clock signal REFCLK_IN, the multiplexer 22 is switched to select the signal DATA. The closed loop of the phase detector 18 then locks to the signal DATA and generates a re-timed data signal RETIMED_DATA and a recovered clock signal RECOVERD_CLK at a number of outputs 56a–56n. The circuit 10 requires the implementation of the reference clock signal REFLCK_IN. Furthermore, the circuit 10 also requires the implementation of the frequency difference detector 16. The circuit 10 implements the half-rate phase detector 18 and a half rate VCO 12.

Referring to FIG. 2, a conventional circuit 60 for performing clock and data recovery in a serial data communication device is shown. FIG. 3 illustrates a timing diagram of the circuit of FIG. 2. The circuit 60 implements an analog phase detector 62 and a digital frequency detector 64. The circuit 60 implements a full-rate clock CLK and corresponding quadrature Q for frequency detection (shown in FIG. 3). The circuit 60 implements dual loop filter design. The output of the phase detector 62 and the output of the frequency detector 64 are added together by the loop filter 66 (i.e., analog summing). The analog phase detector 62 is not robust in the presence of (i) data dependent jitter and/or (ii) missing data transitions. Hence, the circuit 60 provides a low overall jitter tolerance.

SUMMARY OF THE INVENTION

The present invention concerns an apparatus comprising a first circuit, a second circuit and a logic circuit. The first circuit may be configured to generate a first output signal having a first data rate and in response to (i) an input signal having a second data rate and (ii) a clock signal having the second data rate. The second circuit may be configured to generate a second output signal having a third data rate in response to (i) a divided version of the input signal and (ii) the clock signal. The logic circuit may be configured to generate the clock signal in response to (i) the first output signal and (ii) the second output signal.

The objects, features and advantages of the present invention include providing a circuit configured to recover clock and data signals that may (i) be implemented using lower rate components that may result in higher rate circuits being implemented in existing integrated circuit technologies, (ii) reduce power consumption, and/or (iii) enable reference-free clock and data recovery.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
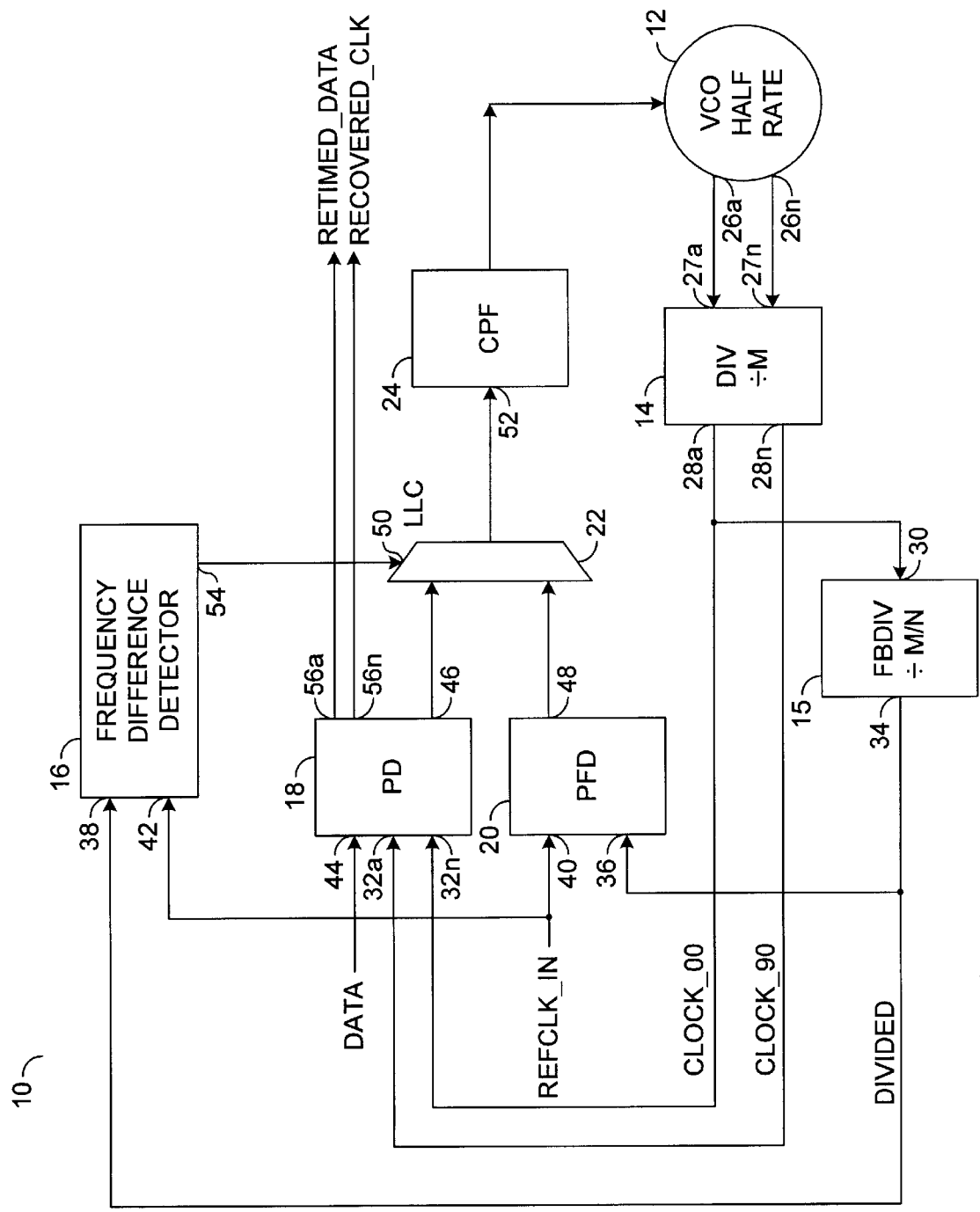
FIG. 1 is a block diagram of a conventional circuit for clock and data recovery using half-rate components.
Figure 2:
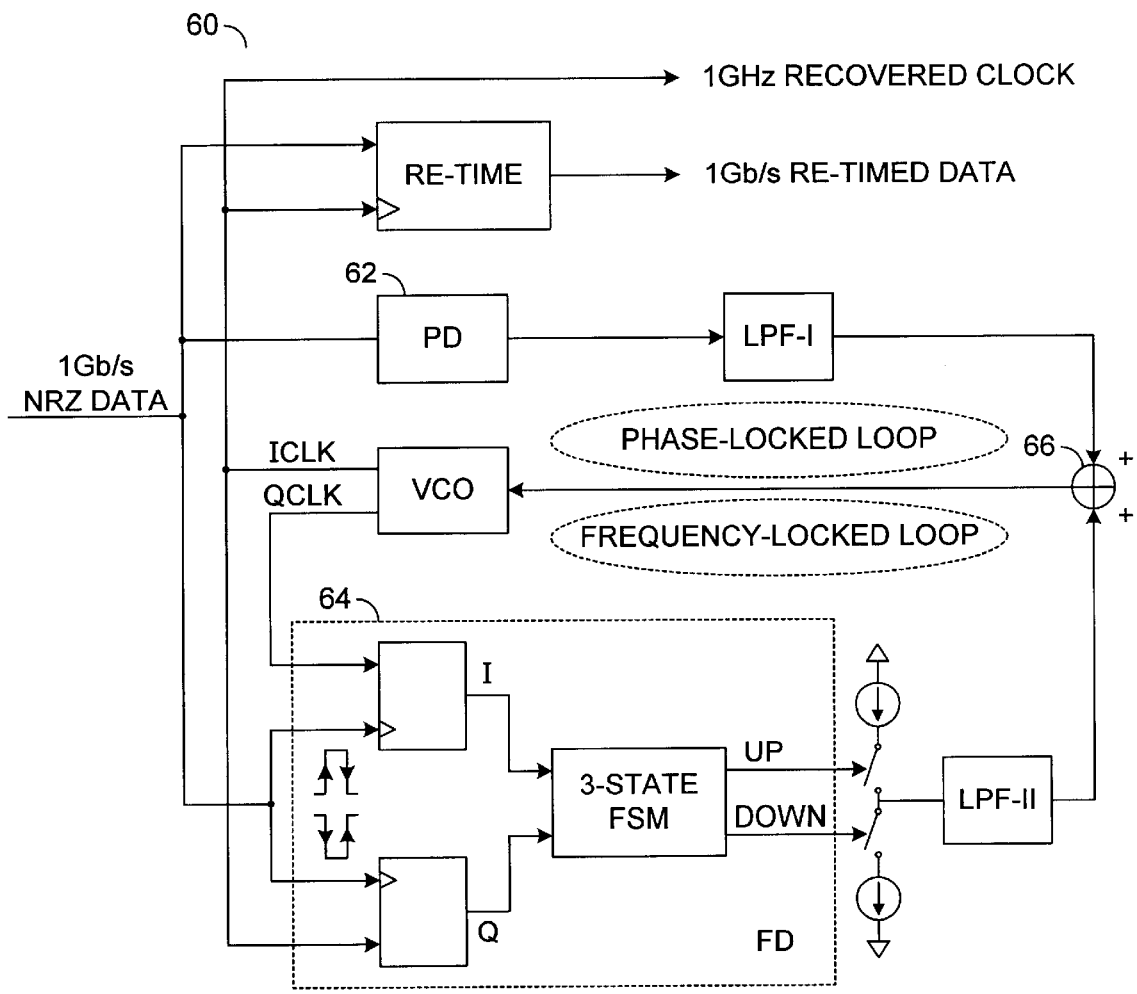
FIG. 2 is a block diagram of another conventional circuit for clock and data recovery.
Figure 3:
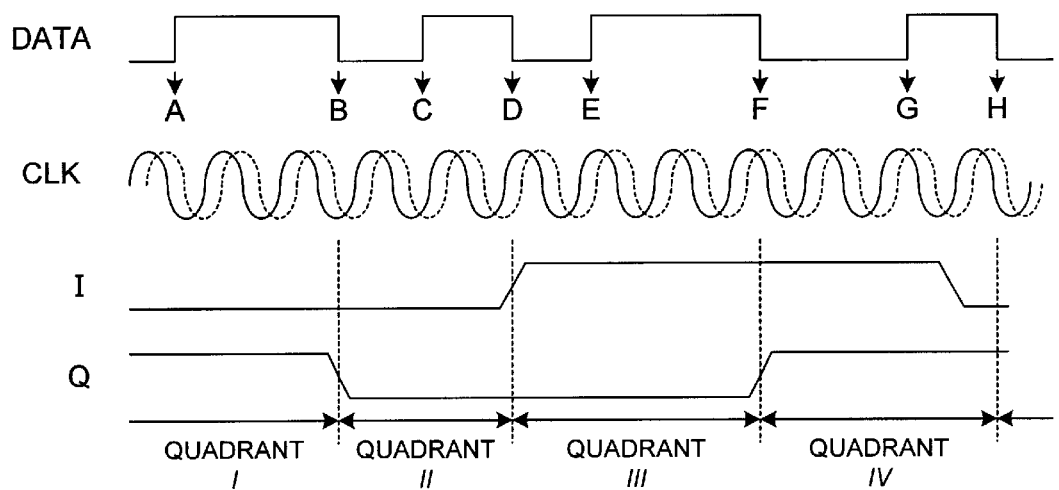
FIG. 3 is a timing diagram of the circuit of FIG. 2.
Figure 3:
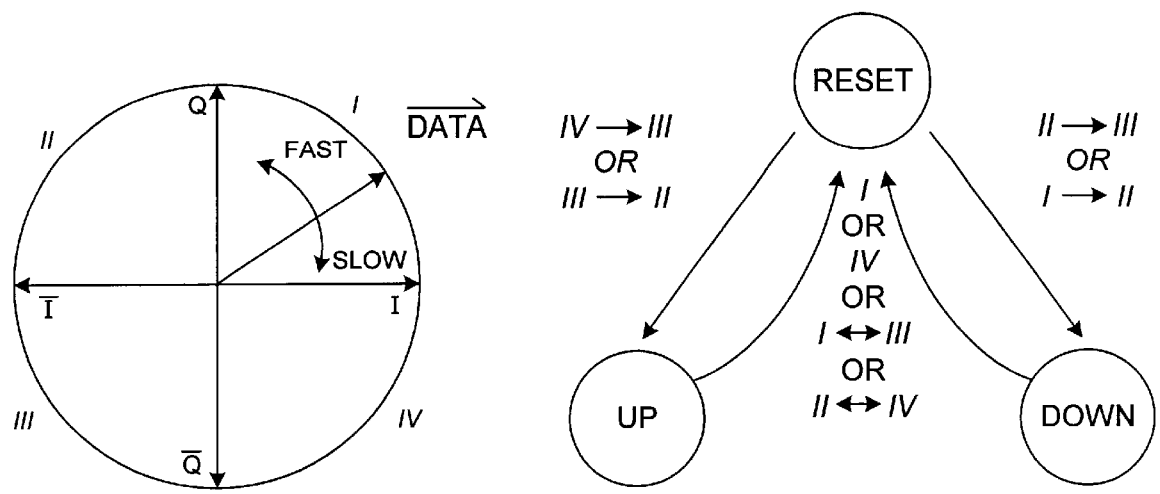
Figure 4:
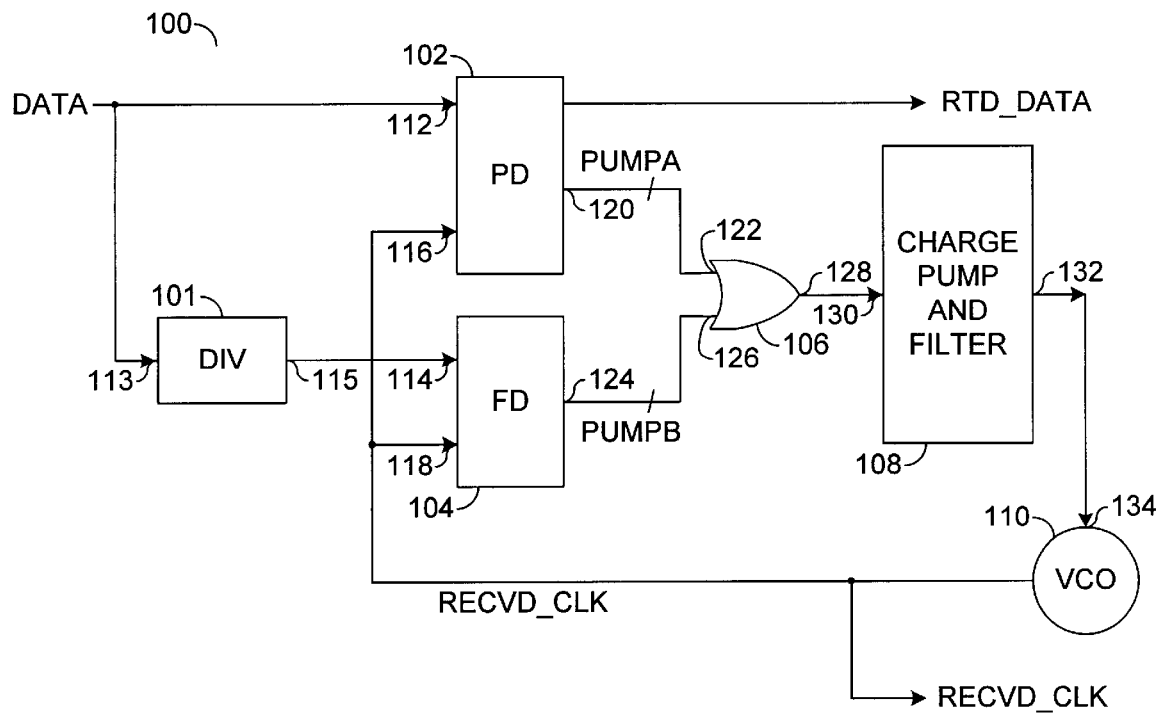
FIG. 4 is a block diagram of a preferred embodiment of the present invention.

Referring to FIG. 4, a block diagram of a circuit 100 is shown in accordance with a preferred embodiment of the present invention. The circuit 100 may be implemented as a linear clock and data recovery phase-lock loop (PLL). The circuit 100 may recover half-rate clock signals (e.g., 0 and 90 degree phases) from a serial input data stream. The circuit 100 may further re-time the data stream with the recovered half-rate clock signals. The circuit 100 may generate (i) two or more re-timed data signals and (ii) a composite re-timed signal in response to the half-rate clock signals. The circuit 100 may be implemented without an external reference clock signal. The circuit 100 may be implemented as a half-rate PLL.

The circuit 100 may comprise a divider block (or circuit) 101, a phase detector (PD) block (or circuit) 102 and a frequency detector (FD) block (or circuit) 104. The phase detector 102 may be implemented, in one example, as a half-rate phase detector. The phase detector 102 may be implemented, in one example, as a linear phase detector generating nominally half-bit wide pump pulses or nominally full-bit wide pump pulses. An example of the frequency detector 104 may be found in co-pending application Ser. No. 09/471,915.

The circuit 100 may further comprise a gate 106, a charge pump block (or circuit) 108 and a VCO block (or circuit) 110. The VCO 110 may be implemented, in one example, as a half-rate VCO. While the phase detector 102 and the VCO 110 have been described generally as half-rate devices, other device rate, such as quarter-rate devices, may be implemented accordingly to meet the design criteria of a particular implementation. The VCO 110 may have an output 111 that may present a signal (e.g., RECVD_CLK). The signal RECVD_CLK may be implemented as a two quadrature clock signal (e.g., a half rate clock signal). In one example, the gate 106 may be implemented as a digital OR gate. However, the gate 106 may be implemented as any type logic gate necessary to meet the design criteria of a particular implementation.

The phase detector 102 may have an input 112 that may receive a signal (e.g., DATA). The signal DATA may also be presented to an input 113 of the divider 101. The signal DATA may operate at a first data rate. The divider 101 may have an output 115 that may present a divided signal (e.g., DIV_DATA). In one example, the divider 101 may be implemented as a divide by 2 divider. However, the divider 101 may be implemented as any type divider (e.g., a divide by N divider, where N is an integer) in order to meet the criteria of a particular implementation. The signal DIV_DATA may be presented to an input 114 of the frequency detector 104. The signal DIV_DATA may operate at a second data rate. The phase detector 102 and the frequency detector 104 may each receive the clock signal RECVD_CLK at an input 116 and 118, respectively. The clock signal RECVD_CLK may be implemented as a recovered clock signal.

The phase detector 102 may have an output 119 that may present a signal (e.g., RTD_DATA). The signal RTD_DATA may be implemented as a re-timed data signal. The signal RTD_DATA may operate at a third data rate that may be the same or different data rate than the first data rate of the signal DATA and/or the second data rate of the signal DIV_DATA.

The phase detector 102 may have an output 120 that may present a signal (e.g., PUMPA). The signal PUMPA may be presented to an input 122 of the gate 106 and may operate at the first data rate of the signal DATA. The phase detector 102 may be configured to generate the signal PUMPA as a narrow pulse width signal.

The frequency detector 104 may have an output 124 that may present a signal (e.g., PUMPB). The frequency detector 104 may present the signal PUMPB in response to a transition of the signal DIV_DATA and/or the signal RECVD_CLK. Since the signal RECVD_CLK may be implemented as a half rate clock signal and the signal DIV_DATA is generally divided by 2, the frequency detector 104 may be implemented as a full rate frequency detector.

The signal PUMPB may operate at a fourth data rate that may be the same or different than the first data rate of the signal DATA, the second data rate of the signal DIV_DATA and/or the third data rate of the signal RTD_DATA. The signal PUMPB may be presented to an input 126 of the gate 106. The signal PUMPA may be implemented as a pump-up signal and a pump-down signal from the phase detector 102. The signal PUMPB may be implemented as a pump-up and a pump-down signal from the frequency detector 104. The pump signals PUMPA and PUMPB may be combined by the gate 106 or may be combined with a counter based multi-plexer scheme as described in co-pending application.

The signals PUMPA and PUMPB may be summed by the gate 106. The frequency detector 104 may generate the signal PUMPB having a constant width during frequency acquisition. The frequency detector 104 may not generate the signal PUMPB when the PLL is in a "lock" state with respect to the frequency of the signal DATA. The frequency detector 104 may enable the gate 106.

During the acquisition state, the signal PUMPB is generally wider than the signal PUMPA. This may prevent the signal PUMPA from overpowering the charge pump 108 and may bring the circuit 100 to the frequency locked state. Once in the frequency locked state, the frequency detector 104 may stop generating the signal PUMPB. When in the frequency locked state, the phase detector 102 may become the sole controller of the PLL loop. Hence, when the circuit is in the locked state (e.g., locked to the signal DATA), the loop is generally not affected by the frequency detector 104.

The gate 106 may have an output 128 that may present a logic signal to an input 130 of the charge pump 108. The charge pump 108 may be implemented to include both a charge pump and a filter. The charge pump 108 may have an output 132 that may generate a control voltage for the VCO 110. The VCO 110 may have an input 134 that may receive the signal from output 132 of the charge pump 108. The VCO 110 may generate the signal RECVD_CLK in response to the signal received at the input 134. The VCO 110 may be implemented to operate within a narrow range (to be described in more detail in connection with FIG. 6).

Figure 5:
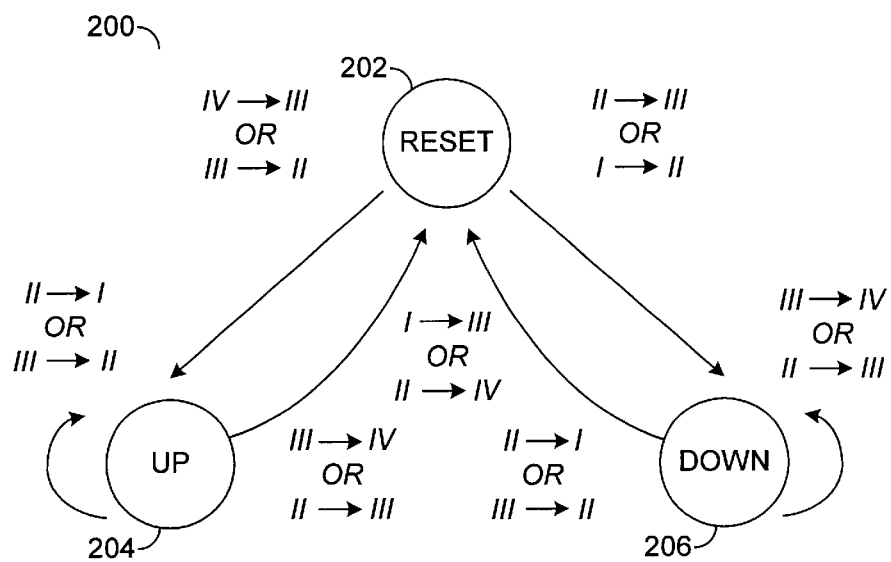
FIG. 5 is a state diagram illustrating the operation of the circuit of FIG. 4.

Referring to FIG. 5, a state diagram (or state machine) 200 is shown in accordance with a preferred embodiment of the present invention. The state diagram 200 generally comprises a "reset" state 202, an "up" state 204 and a "down" state 206. The state machine 200 may respond to a previous state as well as a current transition. For example, a transition between the quadrant III to the quadrant II may (i) cause a transition to the up state 204 if the state machine is in the reset state 202, (ii) remain in the up state 204 if the state machine 200 is in the up state 204 or (iii) cause a transition to the reset state 202 if the state machine 200 is in the down state 206. Other transitions have similar multiple responses.

As illustrated, the next state of the state machine 200 generally depends upon the previous state for each transition between two consecutive quadrants. The state machine 200 may generate every valid up and down transition signal. The state machine 200 may be used to improve lock time when implemented in a frequency detector. A transition of the signal DATA may (i) sample the signal CLK and QCLK (ii) respond with the appropriate action (e.g., either a transition to a new state or remain in the current state).

The state machine 200 may provide an improvement in jitter tolerance by allowing transitions between quadrants II and III. The state machine 200 may be used in clock and data recovery PLL designs that may operate at Gigabit/sec (and higher) data rates. The state machine 200 may enable (i) the implementation of a clock recovery PLL with no reference clock and (ii) improved lock time.

Figure 6:
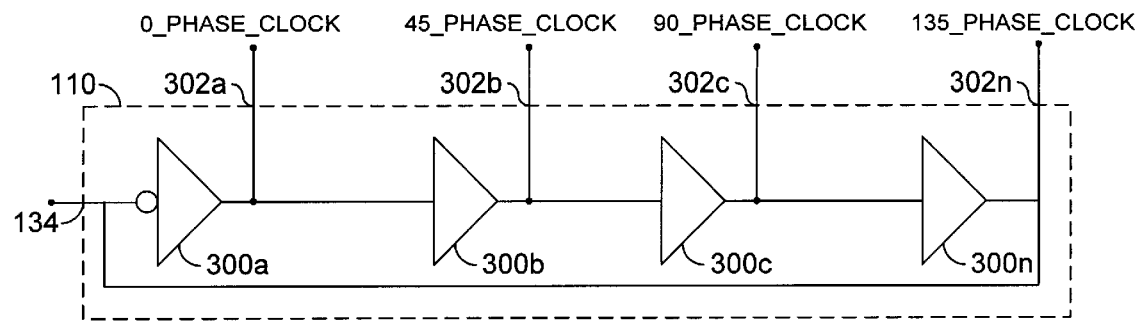
FIG. 6 is a detailed block diagram of the VCO of FIG. 4.

Referring to FIG. 6 a block diagram of the VCO 110 is shown. The VCO 110 may comprise a number of inverters (or buffers) 300a–300n. The inverter 300a may have an output 302a that may present a signal (e.g., 0_PHASE_CLOCK). The signal 0_PHASE_CLOCK may also be presented to the inverter 300b. The inverter 300b may have an output 302b that may present a signal (e.g., 45_PHASE_CLOCK) in response to the signal 0_PHASE_CLOCK. The signal 45_PHASE_CLOCK may also be presented to the inverter 300c. The inverter 300c may have an output 302c that may present a signal (e.g., 90_PHASE_CLOCK) in response to the signal 45_PHASE_CLOCK. The signal 90_PHASE_CLOCK may also be presented to the inverter 300n. The inverter 300n may have an output 302n that may present a signal (e.g., 135_PHASE_CLOCK) in response to the signal 90_PHASE_CLOCK. The signal 135_PHASE_CLOCK may also be presented to the inverter 300a. The inverter 300a may generate the signal 0_PHASE_CLOCK in response to the signal 135_PHASE_CLOCK.

Each of the signals 0_PHASE_CLOCK, 45_PHASE_CLOCK, 90_PHASE_CLOCK and 135_PHASE_CLOCK may be presented as the signal RECVD_CLK at the output 111 of the VCO 110. The VCO 110 may be implemented, in one example, to generate half-rate quadrature clocks. In one example, the VCO 110 may be implemented as a classic ring oscillator VCO. However, the VCO 110 may be implemented as any type VCO in order to meet the criteria of a particular implementation.

Figure 7:
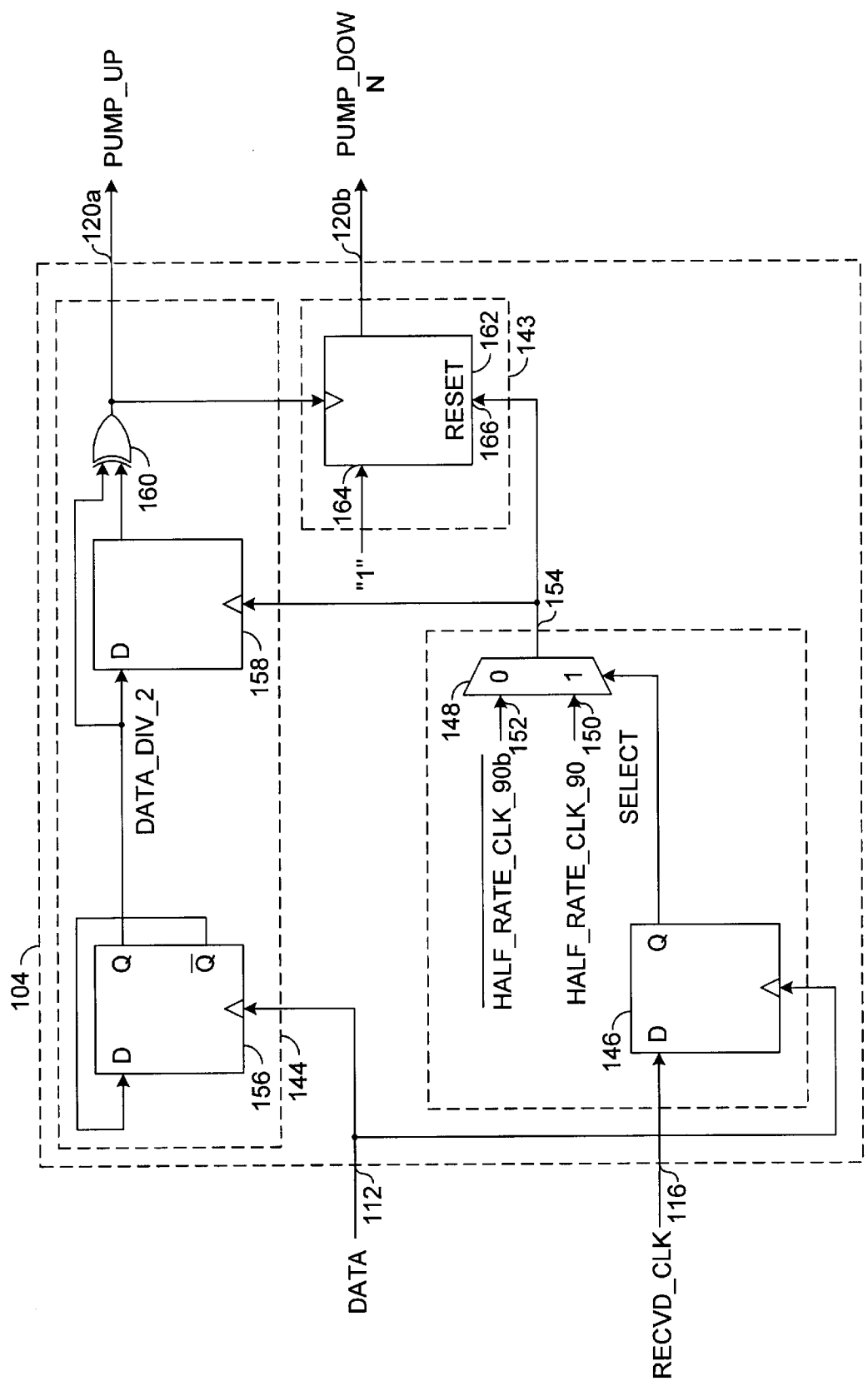
FIG. 7 is a detailed block diagram of the phase detection of FIG. 4.

Referring to FIG. 7, a block diagram of the phase detector 104 is shown. The phase detector 104 generally comprises a control circuit 142, a pump-up circuit 144 and a pump-down circuit 143. The control circuit 142 generally comprises a flip-flop 146 and a multiplexor 148. The flip-flop 146 generally receives the signal DATA at a clock input. The flip-flop 146 generally receives the signal RECVD_CLK at a D input. The flip-flop 146 generally presents a signal (e.g., SELECT), which may be used as a control signal, at a Q output.

The multiplexor 148 generally receives the signal SELECT at a control input, a quadrature of the signal HALF-RATE_CLK (e.g., HALF-RATE_CLK-90) at an input 150, and a digital complement of the quadrature of the signal HALF-RATE_CLK (e.g., HALF-RATE_CLK-90b) at an input 152. The multiplexor 148 generally presents a signal (e.g., FIN_CLK) at an output 154. The signal FIN_CLK may be a control signal.

The pump-up circuit 144 generally comprises a flip-flop 156, a flip-flop 158, and a gate 160. The flip-flop 156 generally receives the data input signal DATA at a clock input. The flip-flop 156 generally presents a signal (e.g., DATA_DIV_2) at a Q output. A Qb output (e.g., a digital complement of the Q output) is generally presented to a D input of the flip-flop 156. The signal DATA_DIV_2 is generally presented to a D input of the flip-flop 158 and a first input of gate 160. The output of the gate 160 may be presented as the signal PUMPA. In one example, the gate 160 may be implemented as an XOR gate. However, other gates may be implemented accordingly to meet the design criteria of a particular implementation.

The pump-down circuit 143 generally comprises a flip-flop 162. The flip-flop 162 generally receives a digital high or "1" at a first input 164. The first input 164 may be a D-input. The flip-flop 162 generally receives the output 154 at a second input 166. The second input 166 may be a reset input. A clock input of the flip-flop 162 generally receives the output of the gate 160. An output of the flip-flop 162 generally presents a signal. The output of the flip-flop 162 may be presented as the signal PUMPA.

In general, the phase detector 100 responds to only one direction of edge transition (e.g., rising edge) of the signal DATA. However, in design applications requiring phase detection using both edges, the phase detector 104 may be replicated such that there are two phase detectors which may respond to the rising and falling edges of the signal DATA, respectively.

Figure 8:
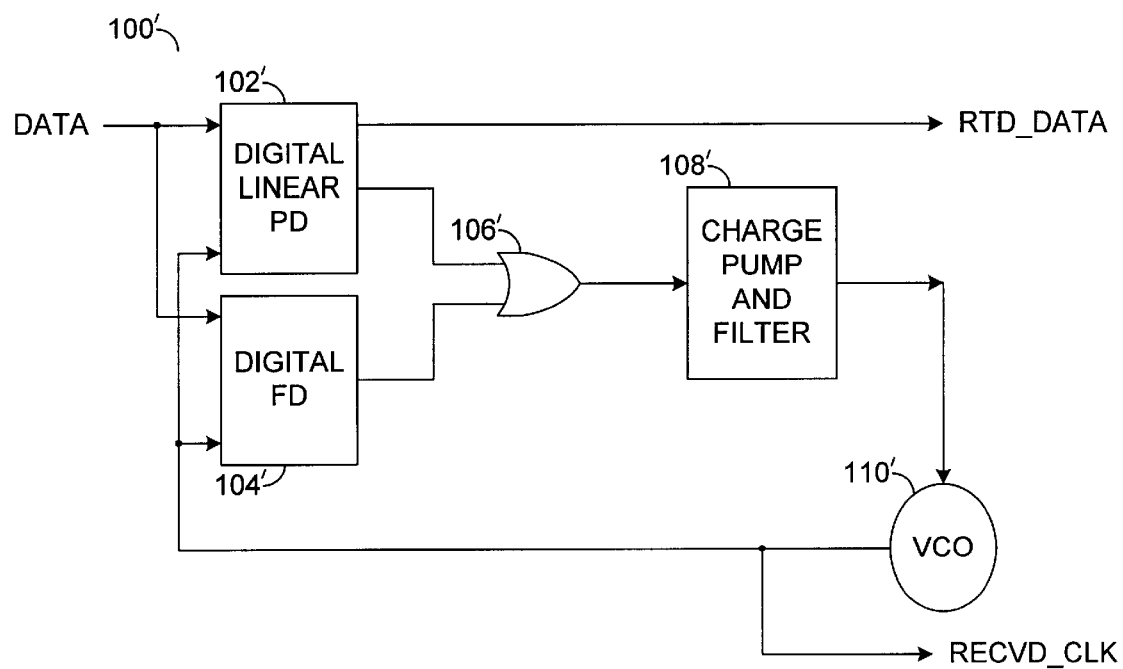
FIG. 8 is a block diagram of an alternate embodiment of the present invention.

Referring to FIG. 8, a block diagram of a circuit 100' in accordance with an alternate embodiment of the present invention is shown. The circuit 100' may operate and/or have similar components to the circuit 100 (marked with primed notation). The full rate frequency detector 104' may be implemented as a single edge triggered frequency detector. The single edge triggered frequency detector 104' may eliminate a need for the divider block 101 shown in FIG. 4.

The circuit 100 may enable reference-free clock and data recovery. The circuit 100 may allow the use of lower rate components which result in higher rate circuits being implemented in existing integrated circuit technologies. The circuit 100 may be implemented without a clock difference detector may reduce the overall circuit area and power consumption.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to generate (a) a first output signal having a first data rate in response to (i) an input signal having a second data rate and (ii) a clock signal having said second data rate and (b) a first data signal having said second data rate;
   a second circuit configured to generate a second output signal having a third data rate in response to (i) a divided version of said input signal and (ii) said clock signal; and
   a logic circuit configured to generate said clock signal in response to (i) said first output signal and (ii) said second output signal.

2. The apparatus according to claim 1, further comprising:
   a divide circuit configured to generate said divided version of said input signal in response to said input signal.

3. The apparatus according to claim 1, wherein said first circuit comprises a digital linear phase detector and said second circuit comprises a digital frequency detector.

4. The apparatus according to claim 1, wherein (i) said first data signal comprises a re-timed data signal and (ii) said clock signal comprises a recovered clock signal.

5. The apparatus according to claim 1, wherein said first data rate, said second data rate and said third data rate are the same data rate or a different data rate.

6. The apparatus according to claim 1, wherein said first and said second output signals are (i) both pump-up signals, (ii) both pump-down signals or (iii) a combination of pump-up and pump-down signals.

7. The apparatus according to claim 1, wherein (i) said first output signal and/or (ii) said second output signal is configured to control said logic circuit.

8. The apparatus according to claim 1, wherein said logic circuit is configured to digitally combine said first and second output signals.

9. The apparatus according to claim 8, wherein said charge pump and filter circuit is configured to control said VCO in response to said gate.

10. The apparatus according to claim 9, wherein said apparatus comprises a half-rate phase-locked loop.

11. The apparatus according to claim 10, wherein said apparatus comprises either (i) a single loop architecture or (ii) a dual loop architecture.

12. An apparatus comprising:
- means for generating (a) a first output signal having a first data rate in response to (i) an input signal having a second data rate and (ii) a clock signal having said second data rate and (b) a first data signal having said second data rate;
- means for generating a second output signal having a third data rate in response to (i) a divided version of said input signal and (ii) said clock signal; and
- means for generating said clock signal in response to (i) said first output signal and (ii) said second output signal.

13. A method for clock data recovery comprising the steps of:
- (A) generating a first output signal having a first data rate in response to (i) an input signal having a second data rate and (ii) a clock signal having said second data rate and (ii) a first data signal having said second data rate;
- (B) generating a second output signal having a third data rate in response to (i) a divided version of said input signal and (ii) said clock signal; and
- (C) generating said clock signal in response to (i) said first output signal and (ii) said second output signal.

14. The method according to claim 13, wherein said first data signal comprises a re-timed data signal.

15. The method according to claim 13, wherein said clock signal comprises a recovered clock signal.

16. The method according to claim 13, wherein said first and second output signals are (i) both pump-up signals, (ii) both pump-down signals or (iii) a combination of pump-up and pump-down signals.

17. The method according to claim 13, wherein (i) said first and/or (ii) said second output signal controls the generation of said clock signal.

18. The method according to claim 13, wherein said step (C) further comprises adding said first and second output signals.

19. An apparatus comprising:
- a first circuit configured to generate a first output signal having a first data rate and in response to (i) an input signal having a second data rate and (ii) a clock signal having said second data rate;
- a second circuit configured to generate a second output signal having a third data rate in response to (i) a divided version of said input signal and (ii) said clock signal; and
- a logic circuit configured to generate said clock signal in response to (i) said first output signal and (ii) said second output signal, wherein said first and said second output signals are (i) both pump-up signals, (ii) both pump-down signals or (iii) a combination of pump-up and pump-down signals.

* * * * *